(12) United States Patent
Vladan

(10) Patent No.: US 8,823,402 B2
(45) Date of Patent: Sep. 2, 2014

(54) CABLE RESISTANCE DETERMINATION IN HIGH-POWER POE NETWORKS

(75) Inventor: Marius I. Vladan, Oudenaarde (BE)

(73) Assignee: Broadcom Corporation, Irvine, CA (US)

( * ) Notice: Subject to any disclaimer, the term of this patent is extended or adjusted under 35 U.S.C. 154(b) by 468 days.

(21) Appl. No.: 13/303,709

(22) Filed: Nov. 23, 2011

(65) Prior Publication Data

US 2013/0127481 A1    May 23, 2013

(51) Int. Cl.
    *G01R 27/08* (2006.01)
    *G01R 31/08* (2006.01)
    *G01R 27/16* (2006.01)
    *H04L 12/10* (2006.01)

(52) U.S. Cl.
    CPC .............. *G01R 27/08* (2013.01); *G01R 31/086* (2013.01); *H04L 12/10* (2013.01); *G01R 27/16* (2013.01)
    USPC ............................ 324/713; 324/691; 324/525

(58) Field of Classification Search
    USPC ......... 324/713, 691, 649, 600, 525, 512, 500, 324/727, 704; 702/133, 127
    See application file for complete search history.

(56) References Cited

U.S. PATENT DOCUMENTS

| | | | |
|---|---|---|---|
| 5,386,188 A | 1/1995 | Minneman et al. | |
| 5,721,688 A | 2/1998 | Bramwell | |
| 5,804,979 A | 9/1998 | Lund et al. | |
| 7,230,412 B2 * | 6/2007 | Stineman et al. | 324/76.11 |
| 7,550,980 B2 * | 6/2009 | Picard et al. | 324/705 |
| 7,818,591 B2 * | 10/2010 | Schindler | 713/300 |
| 7,856,561 B2 * | 12/2010 | Stineman et al. | 713/300 |
| 2005/0197094 A1 | 9/2005 | Darshan | |
| 2006/0164108 A1 | 7/2006 | Herbold | |
| 2006/0178783 A1 | 8/2006 | Herbold | |
| 2008/0164890 A1 | 7/2008 | Admon | |
| 2008/0311877 A1 | 12/2008 | Darshan | |

OTHER PUBLICATIONS

European Search Report issued Dec. 3, 2013, in European Application No. 13003644.5.

* cited by examiner

*Primary Examiner* — Hoai-An D Nguyen
(74) *Attorney, Agent, or Firm* — Oblon, Spivak, McClelland, Maier & Neustadt, L.L.P.

(57) ABSTRACT

An exemplary implementation of the present disclosure is a power sourcing equipment (PSE) for determining a resistance of a powered cable. The PSE includes a first supply voltage to cause a first current to flow through first and second output terminals of the PSE. The PSE also includes a second supply voltage to cause a second current to flow through third and fourth output terminals of the PSE. The PSE further includes a current modulation circuit offsetting the second current from the first current to create an offset voltage between the second and the first supply voltages to determine the resistance of the powered cable. The current modulation circuit can offset the second current from the first current utilizing a variable resistance switch to adjust the second current.

20 Claims, 3 Drawing Sheets

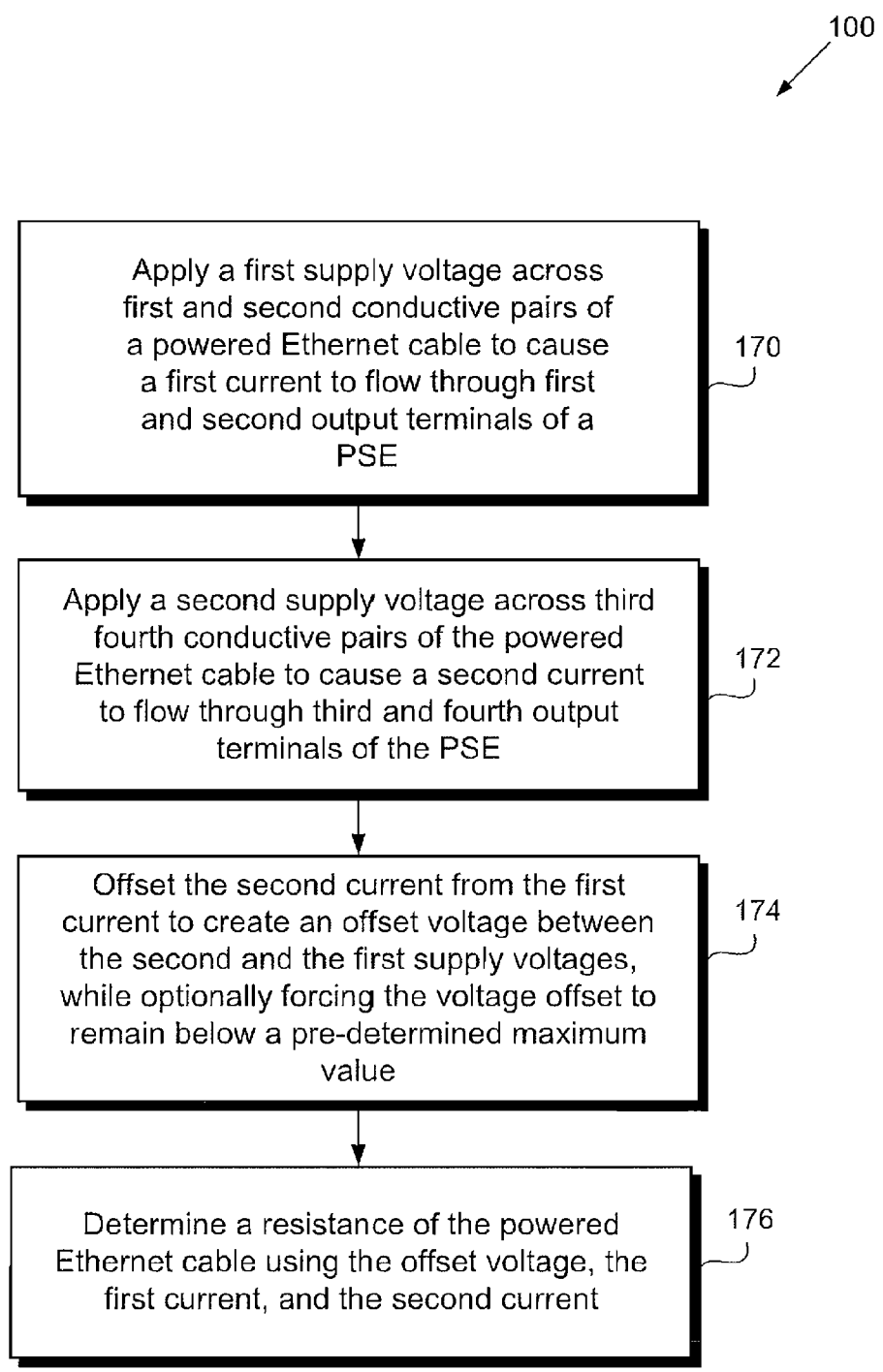

CABLE RESISTANCE DETERMINATION IN HIGH-POWER POE NETWORKS

BACKGROUND

Power over Ethernet (PoE) allows a powered device (PD) such as an Internet Protocol (IP) telephone, a wireless LAN Access Point, and a Security network camera to receive power, along with data, over an Ethernet cable. In a PoE network, a power sourcing equipment (PSE) can be connected to one or more powered devices (PDs) through an Ethernet cable. The PSE can allocate power to the one or more PDs and apply the power to the one or more PDs over the Ethernet cable. An Ethernet cable can include four pairs of wires, with each pair of wires being a twisted pair that is utilized for differential signaling. In some PoE networks, only two of the four pairs of wires in the Ethernet cable are utilized for applying power to the one or more PDs. However, it has become increasingly common for all four pairs of wires in the Ethernet cable to be utilized for applying power to the one or more PDs. By utilizing more than two pairs of wires, the PoE networks can support higher current with reduced cable loss.

In allocating power to one or more PDs in a PoE network, a PSE can determine power loss and budget power allocation amongst the one or more PDs accordingly. Due to imprecise determination of power loss, the PSE may, for example, estimate power loss and, based on the estimated power loss, cease applying power to one or more of the PDs in order to maintain a desired power efficiency in the PoE network. As another example, the PSE may imprecisely allocate less power to one or more of the PDs based on a worst-case scenario. In PoE networks, Ethernet cable resistance is a large contributor to power loss. As such, the PSE would estimate Ethernet cable resistance to determine power loss. For example, time domain reflectometry could be utilized along with average resistance per unit length of an Ethernet cable to estimate Ethernet cable resistance.

SUMMARY

The present disclosure is directed to cable resistance determination in high-power PoE Networks, substantially as shown in and/or described in connection with at least one of the figures, as set forth more completely in the claims.

BRIEF DESCRIPTION OF THE DRAWINGS

FIG. 1 presents an exemplary flowchart illustrating a method for determining resistance of a powered cable, according to an implementation of the present disclosure.

DETAILED DESCRIPTION

Figure 2A:
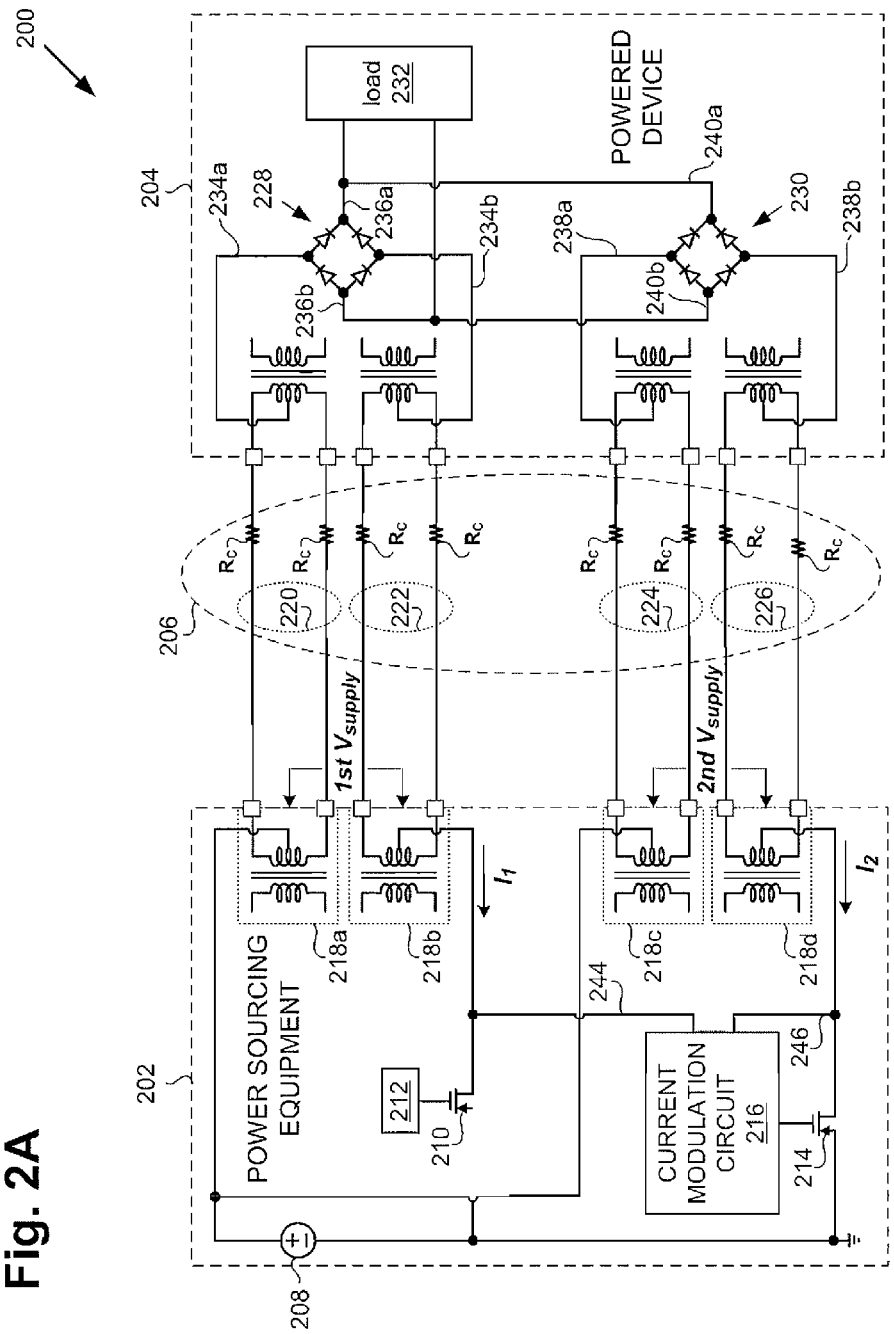
FIG. 2A presents an exemplary diagram of a system for determining a resistance of a powered cable, according to an implementation of the present disclosure.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 presents exemplary flowchart 100 illustrating a method for determining a resistance of a powered cable utilized by a power sourcing equipment (PSE) in a Power over Ethernet (PoE) network. The approach and technique indicated by flowchart 100 are sufficient to describe at least one implementation of the present disclosure, however, other implementations of the disclosure may utilize approaches and techniques different from those shown in flowchart 100. Furthermore, while flowchart 100 is described with respect to Power over Ethernet (PoE) network 200 in FIGS. 2A and 2B, the disclosed inventive concepts are not intended to be limited by specific features of PoE network 200 shown in FIGS. 2A and 2B. Also, while various features may be shown as being included within a particular element, such features can be provided externally in a different implementation. As one example, in various implementations, current modulation circuit 216 and/or power source 208 in FIGS. 2A and 2B can be provided external to PSE 202.

Referring now to flowchart 100 of FIG. 1 and PoE network 200 in FIG. 2A, flowchart 100 includes applying a first supply voltage across first and second conductive pairs of a powered Ethernet cable to cause a first current to flow through first and second output terminals of a PSE (170 in flowchart 100). PoE network 200 includes PSE 202 for determining resistance $R_C$ of powered Ethernet cable 206 (or more generally "powered cable 206").

As shown in FIG. 2A, PoE network 200 includes PSE 202, powered device (PD) 204, and powered Ethernet cable 206. PSE 202 includes power source 208, switch 210, switch controller 212, variable resistance switch 214, current modulation circuit 216, and output terminals 218a, 218b, 218c, and 218d (also referred to collectively herein as "output terminals 218"). Powered Ethernet cable 206 includes conductive pairs 220, 222, 224, and 226. Powered Device 204 includes diodes bridges 228 and 230 and load 232.

PSE 202 can be utilized in PoE network 200 to provide power, along with data, to PD 204 over powered Ethernet cable 206. PD 204 can be, for example, an IP telephone, a wireless LAN Access Point, and a Security network camera. In PoE network 200, PSE 202 is connected to PD 204 through powered Ethernet cable 206. PSE 202 can allocate power to PD 204 and apply the power to PD 204 over powered Ethernet cable 206.

In the present implementation, powered Ethernet cable 206 includes four pairs of wires (i.e. conductive pairs 220, 222, 224, and 226), with each pair of wires being a twisted pair that is utilized for differential signaling. For example, each of output terminals 218 utilize a respective transformer in PSE 202 to generate a differential signal, which is then combined by another transformer in PD 204, in a manner known in the art. It is noted that while the present implementation is described utilizing powered Ethernet cable 206, implementations in accordance with the present disclosure do not require an Ethernet cable and can include more or fewer than four conductive pairs. Furthermore, in some implementations, any conductive pair can instead be a single wire or more than three wires. Also, differential signals may not be utilized in certain implementations.

1st $V_{supply}$ is applied across conductive pairs 220 and 222 of powered Ethernet cable 206 to cause current $I_1$ to flow through output terminals 218a and 218b of PSE 202. FIG. 2A shows PSE 202 including 1st $V_{supply}$ to cause current $I_1$ to flow through output terminals 218a and 218b of PSE 202.

For example, as shown in FIG. 2A, PSE 202 and PD 204 are connected by powered Ethernet cable 206. Conductive pair 220 of powered Ethernet cable 206 is connected to output terminal 218a at one end, and at the other end is received by PD 204. Also shown in FIG. 2A, output terminal 218a is coupled to a positive terminal of power source 208, and conductive pair 220 is received by input 234a of diode bridge 228. Load 232 is coupled to rectified positive rail 236a of diode bridge 228. Similarly, conductive pair 222 of powered Ethernet cable 206 is connected to output terminal 218b at one end, and at the other end is received by PD 204. Also shown in FIG. 2A, output terminal 218b is coupled to a negative terminal of power source 208 through switch 210, and conductive pair 222 is received by input 234b of diode bridge 228. Load 232 is further coupled to rectified negative rail 236b of diode bridge 230.

Thus, in PoE network 200, switch 210 can be utilized to form a current path to cause current $I_1$ to flow through output terminals 218a and 218b of PSE 202. For example, as indicated by action 170 in flowchart 100 in of FIG. 1, switch controller 212 enables switch 210 allowing power source 208 to generate 1st $V_{supply}$ across output terminals 218a and 218b. As such, in the present implementation, a current path is formed from power source 208, through output terminal 218a, conductive pair 220, and diode bridge 228, into load 232, and back through diode bridge 228, conductive pair 222, and output terminal 218b, to ground. As one specific example, 1st Vsupply can be approximately 48 volts.

Referring to flowchart 100 of FIG. 1 and PoE network 200 in FIG. 2A, action 172 in flowchart 100 discloses applying a second supply voltage across third and fourth conductive pairs of the powered Ethernet cable to cause a second current to flow through first and second output terminals of the PSE.

In action 172, 2nd $V_{supply}$ is applied across conductive pairs 224 and 226 of powered Ethernet cable 218 to cause current $I_2$ to flow through output terminals 218c and 218d of PSE 202. FIG. 2A shows PSE 202 including 2nd $V_{supply}$ to cause current $I_2$ to flow through output terminals 218c and 218d of PSE 202.

For example, as shown in FIG. 2A, conductive pair 224 of powered Ethernet cable 206 is connected to output terminal 218c at one end, and at the other end is received by PD 204. Also shown in FIG. 2A, output terminal 218c is coupled to a positive terminal of power source 208, and conductive pair 224 is received by input 238a of diode bridge 230. Load 232 is coupled to rectified positive rail 240a of diode bridge 230. Similarly, conductive pair 226 of powered Ethernet cable 206 is connected to output terminal 218d at one end, and at the other end is received by PD 204. Also shown in FIG. 2A, output terminal 218d is coupled to a negative terminal of power source 208 through variable resistance switch 214, and conductive pair 226 is received by input 234a of diode bridge 230. Load 232 is further coupled to rectified negative rail 240b of diode bridge 230.

Thus, in PoE network 200, variable resistance switch 214 is utilized to form a current path to cause current $I_2$ to flow through output terminals 218c and 218d of PSE 202. For example, in action 172, current modulation circuit 216 enables variable resistance switch 214 allowing power source 208 to generate 2nd $V_{supply}$. As such, in the present implementation, a current path is formed from power source 208, through output terminal 218c, conductive pair 224, and diode bridge 230, into load 232, and back through diode bridge 230, conductive pair 226, and output terminal 218d, to ground. As one specific example, 2nd Vsupply can be approximately 48 volts.

FIG. 2A illustrates PoE network 200 after performing actions 170 and 172 in flowchart 100. In some implementations, actions 170 and 172 are performed concurrently. In other implementations, action 170 is performed prior to action 172. In further implementations, action 172 is performed prior to action 170. In FIG. 2A, PSE 202 is applying 1st $V_{supply}$ and 2nd $V_{supply}$ to PD 204 over powered Ethernet cable 206. Thus, as described above, conductive pairs 220, 222, 224, and 226 are each being utilized for applying power to PD 204. Thus, PoE network 200 supports high current and has low cable loss.

In allocating power to PD 204 in PoE network 200, PSE 202 can determine power loss and budget power allocation to PD 204 accordingly. In PoE network 200, Ethernet cable resistance is a large contributor to power loss. In the present implementation, current modulation circuit 216 can determine Ethernet cable resistance to determine power loss. In the implementation shown, each wire of each conductive pair 220, 222, 224, and 226 has resistance $R_C$ for simplicity. It is noted that actual resistance may vary, however, PoE standards may require no more than 3% resistance imbalance between respective conductive pairs.

In PoE network 200, resistance $R_C$ can be determined using equation 1 as:

$$R_C = 2 * \frac{(1\text{st } V_{supply} - 2\text{nd } V_{supply})}{(1 - 2*k)*(I_1 + I_2)}$$

where $I_1=(1-k)*(I_1+I_2)$ and $I_2=k*(I_1+I_2)$ with k being an imbalance constant between currents $I_1$ and $I_2$. However, after actions 170 and 172, while PSE 202 is applying power to PD 204 utilizing conductive pairs 220, 222, 224, and 226, 1st $V_{supply}$–2nd $V_{supply}$ are typically equal to or almost equal to one another. Similarly, currents $I_1$ and $I_2$ are typically equal to or almost equal to one another. In other words, in equation 1, k may be equal to or almost equal to 0.5. As such, in FIG. 2A, equation 1 cannot be utilized to accurately determine resistance $R_C$.

Referring now to action 174 of FIG. 1 and PoE network 200 in FIG. 2B, action 174 of flowchart 100 includes offsetting the second current from the first current to create an offset voltage between the second and the first supply voltages, while optionally forcing the voltage offset to remain below a predetermined maximum value.

In action 174, current $I_2$ is offset from current $I_1$ to create offset voltage $V_{offset}$ between 2nd $V_{supply}$ and 1st $V_{supply}$ to determine resistance $R_C$. More particularly, in the present implementation, current modulation circuit 216 is offsetting current $I_2$ to current $I_{2offset}=I_2-I_{offset}$ while current $I_1=I_1+I_{offset}$, assuming current drawn by load 232 is substantially unchanged from FIG. 2A.

In the present implementation, for example, current modulation circuit 216 offsets current $I_2$ from current $I_1$ utilizing variable resistance switch 214 to adjust current $I_2$ to current $I_{2offset}$. More particularly, variable resistance switch 214 includes at least one transistor whose Rdson is adjusted by current modulation circuit 216. As an example, FIG. 2B shows variable resistance switch 214 as a transistor that is connected between output terminal 218d and ground. Current modulation circuit 216 is coupled to gate G of variable resistance switch 214 and can adjust Rdson of variable resistance switch 214 by controlling potential applied to gate G. In some preferred implementations, Rdson of variable resistance switch 214 is decreased to offset current $I_2$ from current $I_1$.

However, in other implementations, Rdson of variable resistance switch 214 is increased to offset current $I_2$ from current $I_1$.

In the present implementation, current $I_2$ is changed to current $I_{2offset}$ and current $I_1$ is changed to current $I_{1offset}$ using action 174. In some implementations, for example, switch 210 is also a variable resistance switch, such that current modulation circuit 216 offsets current $I_2$ from current $I_1$ utilizing the variable resistance switch to adjust current $I_1$. For example, current modulation circuit 216 is connected to switch 210 in place of switch controller 212. Also, in some implementations, current modulation circuit 216 does not include variable resistance switch 214. For example, the roles of switch 210 and variable resistance switch 214 in offsetting current $I_2$ from current $I_1$ may be reversed from what is shown. Also, while the present implementation utilizes a variable resistance switch to offset current $I_2$ from current $I_1$, other means can be employed. For example, in various implementations, a current source is utilized in addition to or instead of a variable resistance switch to offset current $I_2$ from current $I_1$.

By offsetting current $I_2$ from current $I_1$ such that current $I_2$ is equal to current $I_{2offset}$ and current $I_1$ is equal to current $I_{1offset}$, imbalance constant k in equation 1 is adjusted away from 0.5. Also, offset voltage $V_{offset}$, which is equivalent to 1st $V_{supply}$–2nd $V_{supply}$ in equation 1, is adjusted away from 0. Thus, current modulation circuit can calculate resistance $R_C$, for example, utilizing measurements of offset voltage $V_{offset}$, current $I_{1offset}$, and current $I_{2offset}$. As such, in some implementations, current modulation circuit 216 determines resistance $R_C$ of powered Ethernet cable 206 using offset voltage $V_{1offset}$, current $I_{1offset}$, and current $I_{2offset}$.

Figure 2B:
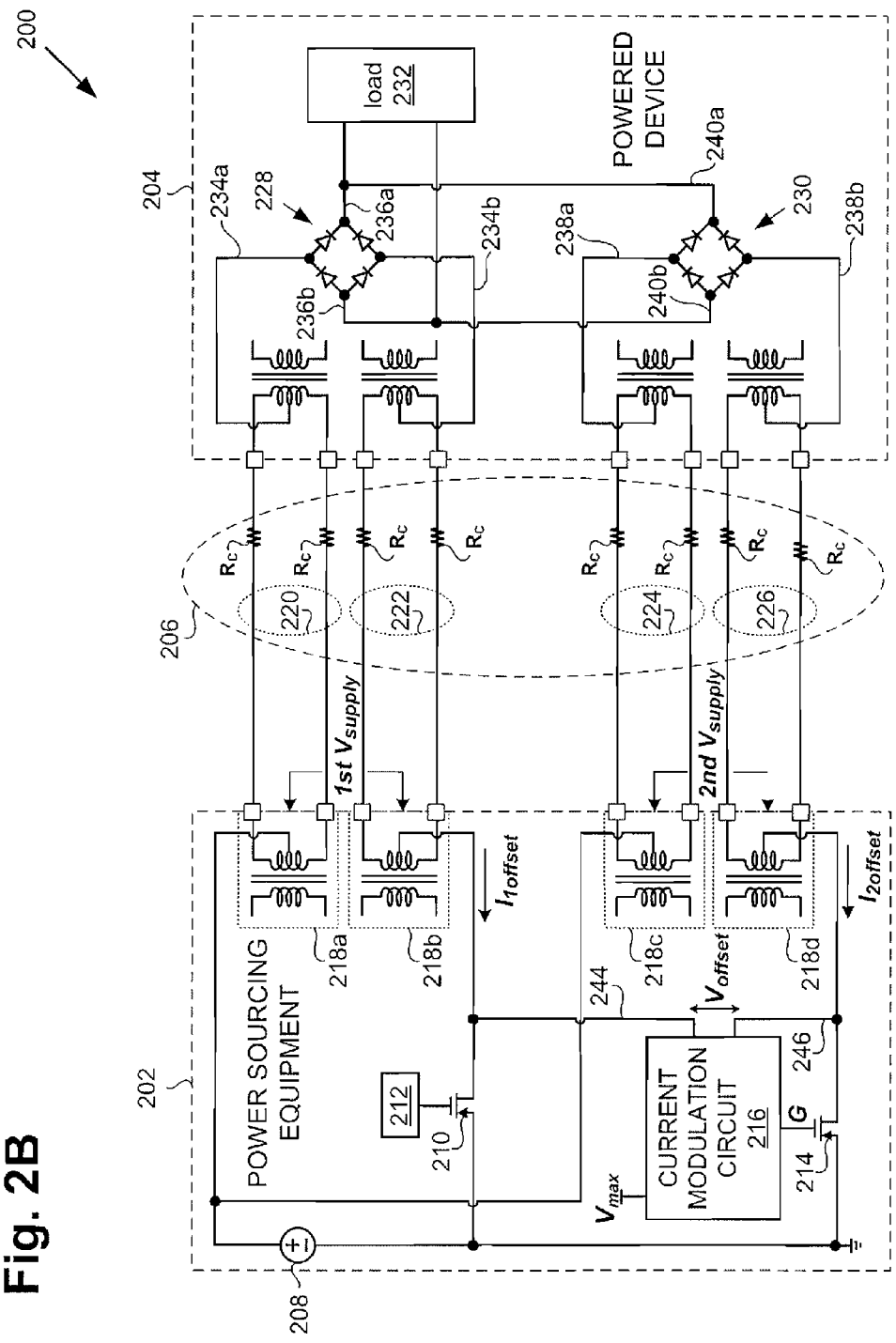
FIG. 2B presents an exemplary diagram of a system for determining a resistance of a powered cable, according to an implementation of the present disclosure.

As shown in FIGS. 2A and 2B, current modulation circuit 216 includes inputs 244 and 246. Input 244 is coupled to conductive pair 222 through output terminal 218b of PSE 202 and input 244 is coupled to conductive pair 226 through output terminal 218d of PSE 202. Thus, current modulation circuit 216 can utilize input 244 to measure current $I_{1offset}$, input 246 to measure current $I_{2offest}$, and inputs 244 and 246 to measure offset voltage $V_{offset}$. It will be appreciated that inputs 244 and 246 are shown to demonstrate measurement capability of current modulation circuit 216. As such, inputs 244 and 246 sink negligible current in the present implementation.

Furthermore, in other implementations, current modulation circuit 216 measures 1st $V_{supply}$ and 2nd $V_{supply}$ individually and calculates offset voltage $V_{offset}$. In other implementations, current $I_{1offset}$+current $I_{2offset}$ is measured from a single wire. Furthermore, at least one of 1st $V_{supply}$, 2nd $V_{supply}$, current $I_{1offset}$, and current $I_{2offset}$ can be estimated, predetermined, and/or calculated in use of equation 1. Also, it will be appreciated that equation 1 is exemplary and other suitable equations can be utilized to calculate or otherwise determine resistance $R_C$.

A larger offset voltage $V_{offset}$ can ensure a more accurate calculation of resistance $R_C$. However, it may be desirable to keep 1st $V_{supply}$ and 2nd $V_{supply}$ within a certain range of one another to ensure proper performance of PoE network 200. In some implementations, current modulation circuit 216 is offsetting current $I_2$ from current $I_1$ to create offset voltage $V_{offset}$ between 2nd $V_{supply}$ and 1st $V_{supply}$ to determine resistance $R_C$ of powered Ethernet cable 206, while forcing offset voltage $V_{offset}$ below maximum value $V_{max}$, which is a pre-determined maximum value.

For example, in the present implementation, current modulation circuit 216 offsets current $I_2$ from current $I_1$ incrementally until maximum value $V_{max}$ is reached. In one implementation, at each increment, current modulation circuit 216 obtains a measurement corresponding to offset voltage $V_{offset}$ (or in other implementations a different measurement, such as at least one of 2nd $V_{supply}$ and 1st $V_{supply}$). Based on the measurement, current modulation circuit 216 can cease incrementally offsetting current $I_2$ from current $I_1$, resulting in offset voltage $V_{offset}$. In one implementation, maximum value $V_{max}$ is approximately 0.5 volts. It will be appreciated that current modulation circuit 216 can utilize other factors in addition to, or instead of the measurement described above to determine when to cease offsetting current $I_2$ from current $I_1$. For example, in some implementations, current modulation circuit 216 also forces current $I_{2offset}$ to be above and/or below a pre-determined value. FIG. 2B illustrates PoE network 200 after performing action 174.

Referring to action 176 of FIG. 1 and PoE network 200 in FIG. 2B, action 176 of flowchart 100 includes determining a resistance of the powered Ethernet cable using the offset voltage, the first current, and the second current.

For example, in the present implementation, current modulation circuit 216 determines resistance $R_C$ of powered Ethernet cable 206 using offset voltage $V_{offset}$, current $I_1$, and current $I_{2offset}$. To determine resistance $R_C$ of powered Ethernet cable 206, current modulation circuit 216 calculates resistance $R_C$ based on equation 1. It will be appreciated that different equations be employed to calculate resistance $R_C$. Resistance $R_C$ can then be utilized, for example, to determine power loss in PoE network 200.

Thus, as described above, current modulation circuit 216 is offsetting current $I_2$ from current $I_1$ to create offset voltage $V_{offset}$ between 2nd $V_{supply}$ and 1st $V_{supply}$ to determine resistance $R_C$ of powered Ethernet cable 206. By measuring offset voltage $V_{offset}$, current $I_{1offset}$, and current $I_{2offset}$, implementations of the present disclosure can utilize those measurements to accurately determine resistance $R_C$.

Furthermore, as described above, PSE 202 is applying 1st $V_{supply}$ and 2nd $V_{supply}$ to PD 204 over powered Ethernet cable 206. As such, implementations of the present disclosure advantageously allow for determining resistance $R_C$ while PD 204 is receiving high-power from PSE 202. In PoE network 200, resistance $R_C$ will vary with temperature of powered Ethernet cable 206. Temperature of powered Ethernet cable 206 is typically significantly higher when applying power as opposed to when power is not being applied. This can result in resistance $R_C$ varying, for example, by as much as 50%. As such, because current modulation circuit 216 can determine resistance $R_C$ while PSE 202 is applying power to PD 204, resistance $R_C$ can be used to accurately determine power loss during operation of PoE network 200. By accurately determining power loss, PSE 202 can exhibit high precision in budgeting power allocation amongst one or more PDs.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A power sourcing equipment (PSE) for determining a resistance of a powered cable, said PSE comprising:
   a first supply voltage to cause a first current to flow through first and second output terminals of said PSE;
   a second supply voltage to cause a second current to flow through third and fourth output terminals of said PSE;
   a current modulation circuit offsetting said second current from said first current to create an offset voltage between said second and said first supply voltages to determine said resistance of said powered cable.

2. The PSE of claim 1 wherein said current modulation circuit offsets said second current from said first current utilizing a variable resistance switch to adjust said second current.

3. The PSE of claim 2 wherein said variable resistance switch comprises at least one transistor whose Rdson is adjusted.

4. The PSE of claim 1 wherein said current modulation circuit forces said offset voltage to remain below a pre-determined maximum value.

5. The PSE of claim 1 wherein said PSE applies said first and second supply voltages to a powered device over said powered cable.

6. The PSE of claim 1 wherein said PSE is utilized in a Power over Ethernet (PoE) network.

7. A method for determining a resistance of a powered cable utilized by a power sourcing equipment (PSE) in a Power over Ethernet (PoE) network, the method comprising:
   applying a first supply voltage to cause a first current to flow through first and second output terminals of said PSE;
   applying a second supply voltage to cause a second current to flow through third and fourth output terminals of said PSE;
   offsetting said second current from said first current to create an offset voltage between said second and said first supply voltages to determine said resistance of said powered cable.

8. The method of claim 7 wherein said offsetting said second current from said first current utilizes a variable resistance switch to adjust said second current.

9. The method of claim 8 wherein said variable resistance switch comprises at least one transistor whose Rdson is adjusted.

10. The method of claim 7 comprising forcing said offset voltage to remain below a pre-determined maximum value.

11. The method of claim 7 wherein said first and second supply voltages are applied to a powered device over said powered cable.

12. The method of claim 7 wherein a current modulation circuit determines said resistance of said powered cable using said offset voltage.

13. The method of claim 7 wherein a current modulation circuit determines said resistance of said powered cable using said first current and said second current.

14. A system for determining a resistance of a powered cable, the system comprising:
   a powered device;
   a PSE applying a first supply voltage to said powered device over said powered cable and causing a first current to flow through first and second conductive pairs in said powered cable;
   said PSE applying a second supply voltage to said powered device over said powered cable and causing a second current to flow through third and fourth conductive pairs in said powered cable;
   a current modulation circuit offsetting said second current from said first current to create an offset voltage between said second and said first supply voltages to determine said resistance of said powered cable.

15. The system of claim 14 wherein said current modulation circuit offsets said second current from said first current utilizing a variable resistance switch to adjust said second current.

16. The system of claim 14 wherein said variable resistance switch comprises at least one transistor whose Rdson is adjusted.

17. The system of claim 14 wherein said current modulation circuit forces said offset voltage to remain below a pre-determined maximum value.

18. The system of claim 14 wherein said current modulation circuit is within said PSE.

19. The system of claim 14 wherein said current modulation circuit determines said resistance of said powered cable using said offset voltage.

20. The system of claim 14 wherein said powered cable is a powered Ethernet cable.

* * * * *